United States Patent [19]
Kielmeyer, Jr.

[11] Patent Number: 5,192,875
[45] Date of Patent: Mar. 9, 1993

[54] ANALOG FREQUENCY DIVIDER UTILIZING TWO AMPLIFIERS AND A LC RESONANT CIRCUIT

[75] Inventor: Ronald F. Kielmeyer, Jr., Tempe, Ariz.

[73] Assignee: Motorola, Inc., Schaumburg, Ill.

[21] Appl. No.: 787,474

[22] Filed: Nov. 4, 1991

[51] Int. Cl.$^5$ .............................. H03B 19/00
[52] U.S. Cl. ........................ 307/219.1; 307/271; 328/15; 328/25
[58] Field of Search ............ 307/219.1, 271; 328/15, 328/25, 113, 223; 331/117 R, 117 FE

[56] References Cited

U.S. PATENT DOCUMENTS

| | | | |
|---|---|---|---|
| 3,140,447 | 7/1964 | Olbrych et al. | 328/15 |
| 3,381,137 | 4/1968 | Brown | 307/41 |
| 3,536,933 | 10/1970 | Sanders | 307/219.1 |
| 3,555,303 | 1/1971 | Kozawa | 328/15 |
| 3,997,796 | 12/1976 | Sanders et al. | 307/219.1 |
| 4,327,343 | 4/1982 | Cormish | 307/219.1 |
| 4,631,500 | 12/1986 | Rauscher | 331/51 |
| 4,713,556 | 12/1987 | Yamamoto et al. | 307/219.1 |

OTHER PUBLICATIONS

"Fractional-Frequency Generators Utilizing Regenerative Modulation", R. Miller, Proceedings of the IRE, Jul. 1939, pp. 446-457.

"GaAs Monolithic Analogue Frequency Halver", Electronics Letters, vol. 22, No. 15, Jul. 17, 1986, pp. 773-774.

"A New Reversible Frequency Halver/Doubler Device", Z. Nativ, RAFAEL-Armament Development Authority, IEEE, '87, pp. 921-924.

"Novel Design Approach for X-Band GaAs Monolithic Analog ¼ Frequency Divider", Honjo et al, IEEE, '86, pp. 436-441.

Primary Examiner—William L. Sikes
Assistant Examiner—Toan Tran
Attorney, Agent, or Firm—Robert M. Handy

[57] ABSTRACT

An microwave analog frequency divider capable of ten percent bandwidth at 10 GHz has push-push amplifiers forming an injection locked oscillator. The input frequency $f_i$ is injected at the amplifier reference terminals. The amplifier control terminals are coupled by L's and the reference terminals are coupled by C's and the reference and control terminals form with the L's and C's a resonant circuit tuned approximately to the output frequency $f_o = f_i/N$, where N is the divisor. Parallel resonant circuits in the $f_i$ injection path have high impedance at $f_o$ to prevent loading of the oscillator. A control device in the $f_i$ injection path turns the oscillator on when $f_i$ is present and off when $f_i$ is absent. Matching networks are included at input, output and between the control device and the oscillator to obtain efficient operation.

20 Claims, 1 Drawing Sheet

5,192,875

ANALOG FREQUENCY DIVIDER UTILIZING TWO AMPLIFIERS AND A LC RESONANT CIRCUIT

FIELD OF THE INVENTION

The present invention concerns an improved means and method for dividing an input frequency to provide a lower output frequency.

BACKGROUND OF THE INVENTION

There is a substantial and on-going need in the electronic arts for dividing an input frequency to produce a lower output frequency. Dividers are much used, for example, in connection with phase-locked loops (PLL's).

The higher the input frequency the more difficult it is to accomplish frequency division. When the input frequency is in the microwave range, as for example above about 0.5 GHz and more typically 1 to 20 GHz or above, the problem of obtaining efficient frequency division is most acute, especially obtaining frequency division across a significant bandwidth of input frequencies.

A further consideration of importance in connection with microwave frequency division is that the components used to provide frequency division should be of a size and character as to be readily integrated in Monolithic Microwave Integrated Circuits (MMIC's). This is especially important for frequencies above about 5 GHz.

It is known to use regenerative analog frequency dividers for microwave applications. Regenerative dividers are described for example in U.S. Pat. Nos. 3,140,447, 3,381,137 and 4,631,500. Regenerative dividers use a feedback loop containing amplification, filtering and mixing functions. However, they suffer from a number of disadvantages well known in the art, as for example, narrow bandwidth and spurious oscillations.

Logic gates can be used for digital frequency division but are generally limited to lower frequencies than analog frequency dividers and thus are not useful over a sufficient range of microwave frequencies.

Parametric analog frequency dividers are also known. For example, a parametric frequency divider employing FET's and operating up to 12 GHz is described in "GaAs Monolithic Analogue Frequency Halver", by Stapelton et al., *Electronics Letters*, Vol. 22, No. 15, pages 773-774, Jul. 17, 1986. Stapelton's circuit is reproduced as FIG. 1. While this circuit functions, it has some disadvantages.

Thus, a need continues to exist for an improved frequency divider, especially a frequency divider able to operate at microwave frequencies. It is further important that such frequency divider be suitable for implementation as a Monolithic Microwave Integrated Circuit (MMIC). As used herein the term Monolithic Microwave Integrated Circuit and the abbreviation MMIC are intended to refer to a circuit formed of components which can be constructed substantially entirely on and/or in the surface of a substrate utilizing integrated circuit fabrication techniques. Examples of components useful for MMIC's are monolithic transistors, diodes and junction capacitors, and thin (or thick) film capacitors, inductors, resistors and interconnections.

SUMMARY OF THE INVENTION

The present invention provides an improved frequency divider for receiving an input frequency $f_i$ and providing an output frequency $f_o = f_i/N$ where N is an even integer.

In its most general form, the frequency divider comprises first and second amplifiers (e.g., transistors), each having control, reference and load terminals, first and second tuned circuits having high impedance at $f_o$, and a series tuned circuit coupled between the control and reference terminals of the first and second amplifiers. The series tuned circuit desirably comprises inductance coupled between the control terminals and capacitance coupled between the reference terminals of the first and second amplifiers.

In a preferred embodiment, a first port of the first tuned circuit is desirably coupled to the reference terminal of the first amplifier and a first port of the second tuned circuit is coupled to the reference terminal of the second amplifier and the second terminals of the tuned circuits are coupled to a port for receiving input frequency $f_i$. The output frequency $f_o$ is derived from a load terminal of one or more of the amplifiers. In a preferred embodiment, load impedances, preferably inductors, are coupled to the load terminals of the amplifiers.

The port for receiving input frequency $f_i$ desirably comprises a control device having an output terminal coupled to the second ports of the first and second tuned circuits, a control terminal coupled to an input for input frequency $f_i$, and a reference terminal coupled to potential source. When $f_i$ is applied to the input, the control device turns on, thereby coupling the input frequency $f_i$ to the second ports of the first and second tuned circuits and biasing the amplifiers into an active state. When $f_i$ is removed from the input, the control device substantially blocks the input frequency $f_i$ from the second ports of the first and second tuned circuits and disables the amplifiers so that they are incapable of oscillation.

Matching elements are desirably provided between the control device and the input for frequency $f_i$ and between an output terminal of one of the amplifying devices and an output for frequency $f_o$.

A method for dividing an input frequency $f_i$ by a number N, is provided generally comprising, introducing input frequency $f_i$, coupling $f_i$ to a frequency generator comprising two amplifiers having control, reference and load terminals producing output frequency $f_o = f_i/N$ when $f_i$ is present. In a preferred embodiment of the method, $f_i$ is coupled to the reference terminals of the amplifiers, the control terminals are coupled together by at least one inductance, and the reference terminals are coupled together by at least one capacitance. At least one of the load terminals is coupled to an output. The method comprises resonating the inductor and capacitor and any parasitic impedance associated with the control terminals substantially at $f_i/N$ and operating the transistors in push-push to produce an oscillating signal of frequency $f_o = f_i/N$ at the output which is phase locked to $f_i$.

DETAILED DESCRIPTION OF THE DRAWINGS

Figure 1:
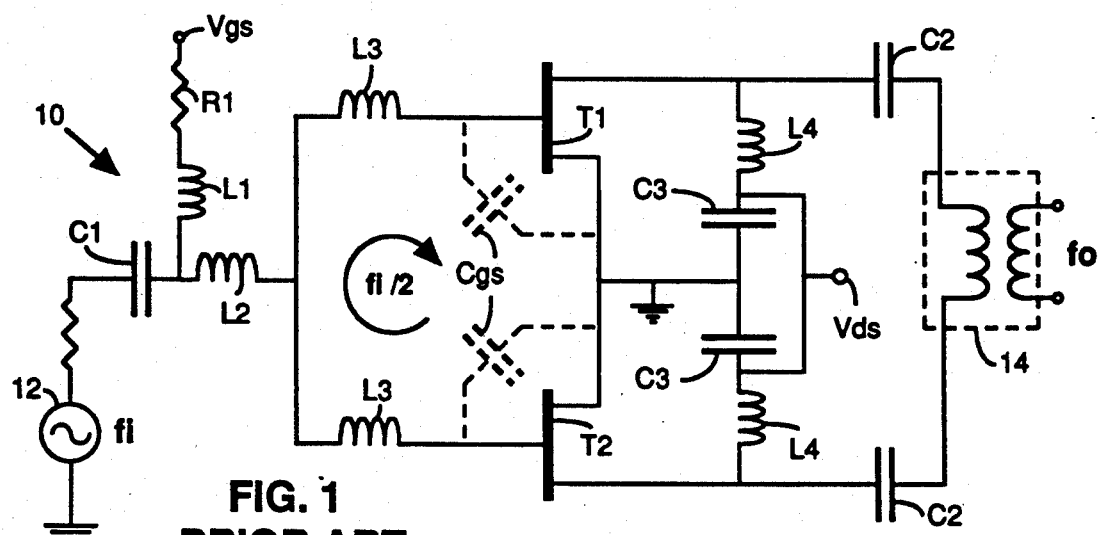
FIG. 1 is a simplified schematic circuit diagram of a prior art analog frequency halver according to Stapelton et al., (supra)

FIG. 1 is a simplified schematic circuit diagram illustrating the design and operation of prior art analog frequency halver 10 according to Stapelton et al. (supra). Halver 10 accepts input frequency $f_i$ from signal source 12 and provides output frequency $f_o = f_i/2$ from balun 14. Frequency halver 10 comprises common source FETS T1, T2, capacitors C1-C3, inductors L1-L4, resistor R1 and output balun 14. The combination of inductors L3 and gate input capacitances $C_{gs}$ of the FETS is resonant at $f_i/2$. The combination of capacitor C1 and inductor L2 provides input impedance matching at $f_i$ and a high impedance at $f_i/2$. Output matching is provided by C2 and L4 and drain bias to the FETS is provided though L4 from potential Vds. Gate bias is provided though L1 and R1 from potential Vgs.

The input signal ($f_i$) splits through L3 and appears with zero net phase difference on the gates and drains of FETS T1, T2 and also appears in phase at the inputs to balun transformer 14. Thus, the input signal $f_i$ is not coupled to the output of balun 14. The sub-harmonic frequency $f_i/2$ circulating through L3 and $C_{gs}$ appears with 180° phase difference at the gates and drains of T1, T2, and also at the inputs to balun 14. Thus, sub-harmonic frequency $f_i/2$ determined by the combination of L3 and $C_{gs}$ is coupled to the output of balun 14 as output frequency $f_o$.

Because of its simple design, the circuit of FIG. 1 suffers from several limitations. For example, (i) the proper operation of the circuit is critically dependent on the magnitude of the non-linear parasitic gate-source capacitance $C_{gs}$ of the FET's (which varies with the operating point and from device to device), (ii) the Q of the series resonant circuit formed by $C_{gs}$ and L3 must be high in order for sub-harmonic oscillations to occur (high Q components are difficult to obtain in monolithic form), (iii) the input series resonant circuit formed by C1 and L2 must be adjusted so that its impedance is low at $f_i$ and high at $f_o = f_i/2$, where $f_i$ is the input frequency and $f_o$ is the output frequency, and (iv) the circuit requires substantial input power in order to operate with a significant bandwidth.

Figure 2:
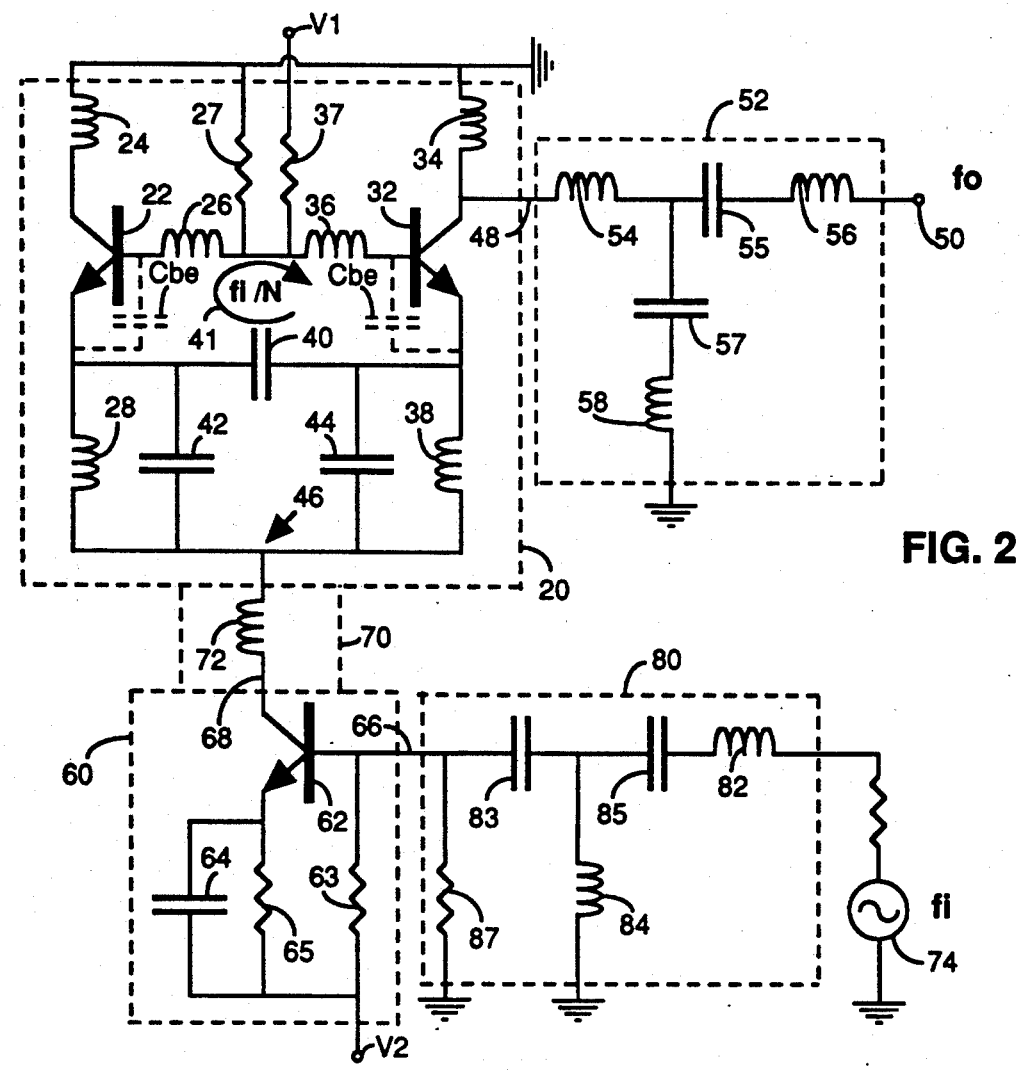
FIG. 2 is a simplified schematic diagram of an analog frequency divider according to a preferred embodiment of the present invention.

These and other limitations of the prior art are overcome or ameliorated by the present invention illustrated schematically in FIG. 2. Referring now to FIG. 2, frequency divider 20 comprises amplifiers 22, 32, inductances 24, 26, 28 and 34, 36 and 38, resistances 27, 37 and capacitances 40, 42, 44. Input signal $f_i$ is introduced at node 46 and output signal $f_o = f_i/N$ is removed at line 48. N is an even integer, usefully in the range of about 2 to 10, more conveniently in the range of about 2 to 4 and typically about 2.

Amplifiers 22, 32 may be any type of active device or combination of devices, but bipolar transistors and FETS are preferred. For convenience of explanation and not intended to be limiting, bipolar transistors are illustrated for amplifiers 22, 32 and input capacitances $C_{be}$ shown in FIG. 2 are intended to represent the input capacitance of amplifiers 22, 32, whatever their type.

The combinations of inductors 28, 38 and associated capacitors 42, 44 are tuned circuits resonant at $f_i/N$ so that a high impedance is obtained at that frequency between node 46 and the reference electrodes (e.g. emitters) of amplifiers 22, 32. Elements 28, 42 form one parallel resonant tuned circuit and elements 38, 44 form another parallel resonant tuned circuit. The combination of inductance 26, 36, capacitance 40 and input capacitances $C_{be}$ form a series resonant circuit between the control and reference terminals of amplifiers 22, 32. This circuit is resonant at $f_i/N$ so that a low impedance exists at that frequency in loop 41 represented by the control electrodes (e.g., bases) and reference electrodes (e.g., emitters) of amplifiers 22, 32 and inductance 26, 36 and capacitance 40. Sub-harmonic signals (i.e., $f_i/N$) circulating in loop 41 are amplified by amplifiers 22, 32 and appear across inductances 24, 34 coupled to the load terminals (e.g., collectors) of amplifiers 22, 32.

One of the features of the arrangement of FIG. 2 is that capacitance 40 produces a potential difference at the frequency $f_i/N$ between the reference terminals of amplifiers 22, 32 and is typically larger than $2C_{be}$, so that the resonant frequency of loop 41 is comparatively insensitive to variations in $C_{be}$. This is desirable Control electrode bias to amplifiers 22, 32 is conveniently supplied through the combination of resistors 27, 37 from DC bias voltage V1 and through controller 60 from voltage source V2, but other means well known in the art for biasing amplifiers 22, 32 may also be used.

Output line 48 is desirably but not essential coupled to output port 50 by matching network 52. In a preferred embodiment, matching network 52 comprises inductances 54, 56, 58 and capacitances 55, 57 arranged substantially as in FIG. 2.

Input frequency $f_i$ is desirably but not essentially supplied to node 46 through controller 60. In a preferred embodiment, controller 60 comprises control device (e.g., bipolar transistor) 62, capacitance 64 and bias resistors 63, 65. Control device 62 is coupled to DC voltage V2 through resistor 63.

Controller 60 receives $f_i$ on line 66 and provides it to node 46 via line 68. Matching impedance 70, as for example, inductance 72 is desirably provided between controller output 68 and node 46 of divider 20. Control device 62 is ordinarily biased to cut-off in the absence of signal $f_i$ so that no signal $f_i$ reaches node 46. A further desirable action of control 60 is that of varying the operating point or gain of amplifiers 22, 32 so that (i) in the presence of signal $f_i$ on line 66, amplifiers 22, 32 are active and have sufficient gain to support oscillations at $f_i/N$, and (ii) in the absence of signal $f_i$ on line 66, amplifiers 22, 32 are inactive or of reduced gain so that no oscillations occur in divider 20.

Signal source 74 providing input frequency $f_i$ is desirably coupled to input line 66 of controller 60 by matching network 80. In a preferred embodiment, matching network 80 comprises inductances 82, 84 and capacitances 83, 85. DC Bias on the control terminal of amplifier or device 62 is provided though resistor 87.

The operation of the circuit of FIG. 2 will now be described. Amplifiers 22, 32 together with load inductances 24, 34, and tuning inductances 26, 36 in conjunction with capacitor 40 and parasitics $C_{be}$, form an injection locked push-push oscillator near the frequency $f_i/N$. In the quiescent state, amplifiers 22, 32 ordinarily do not support oscillation and there is no output from divider 20. At very high biases, the gain of the amplifiers may be high enough that the circuit will break into free-running self-oscillation even in the absence of injection frequency $f_i$, but this is not an ordinary condition of operation.

The circuits 28, 42 and 38, 44 are parallel resonant at $f_i/N$ so that substantially zero current is developed in their respective branches at $f_i/N$. As the gain of amplifiers 22, 32 is increased, e.g., by changing their DC bias current, the circuit begins to oscillate near $f_i/N$ and injection of input frequency $f_i$ phase locks the oscillation to the input signal.

The branch currents are zero in the parallel resonant circuits formed by 28, 42 and 38, 44 and the reference terminal (e.g., emitter) currents of amplifiers 22, 32 are of equal magnitude but opposite phase, i.e., a push-push amplifier. The currents of all odd harmonics are out of phase and the currents of even harmonics are in phase. Therefore, the even currents in the 28, 42 and 38, 44 branches are in phase and will sum at common node 46.

Control device 62 has a dual purpose. It controls the bias of amplifiers 22, 32 so that the divider/oscillator 20 does not ordinarily oscillate without the presence of $f_i$ on line 66. Capacitor 64 is substantially an AC short circuit at frequency $f_i$ so that device 62 acts as a common reference (e.g., common emitter) amplifier. Capacitance 83 and inductance 84 are used to match the amplifier to fifty Ohms.

Upon application of the input signal $f_i$, the incident currents into push-push amplifier/oscillator 20 are split equally with equal phase. The excitation by $f_i$ enhances the instability which naturally exists and the push-push amplifier/oscillator will start to oscillate and the incident signal $f_i$ injection locks the harmonic currents of the push-push oscillator to product $f_o = f_i/N$.

Inductance 54 and capacitance 57 form a low pass filter which removes the $f_i$ component from the output at node 50. Capacitance 55 and inductance 56 are series resonant at $f_i/N$ to facilitate this and provide a DC block to output node 50. Resistors 27, 37, 63, 65, and 87 are chosen using means well known in the art to provide the desired bias for active elements 22, 32 and 62.

EXAMPLE

The following are suitable component values for a frequency divider operating in the microwave region above about 5 GHz. The reference numeral for each element is shown followed by the component value in nanoHenries for the inductances, in picoFarads for the capacitances and in Ohms for the resistances.

| Inductances | | Capacitances | | Resistances | |
|---|---|---|---|---|---|
| # | Value | # | Value | # | Value |
| 24 = | 0.2 | 40 = | 1 | 27 = | 2500 |
| 26 = | 0.7 | 42 = | 2 | 37 = | 2500 |
| 28 = | 0.5 | 44 = | 2 | 63 = | 7000 |
| 34 = | 0.2 | 55 = | 1.4 | 65 = | 200 |
| 36 = | 0.7 | 57 = | 0.6 | 87 = | 3000 |
| 38 = | 0.5 | 64 = | 10 | | |
| 54 = | 0.4 | 83 = | 1 | | |
| 56 = | 0.4 | 85 = | 0.6 | | |
| 58 = | 0.4 | | | | |
| 72 = | 0.7 | | | | |
| 82 = | 0.4 | | | | |
| 84 = | 0.44 | | | | |

Transistors 22, 32 and 62 had $f_t$ values (frequency for unity gain) of above 10 GHz.

The divider had a free running (no injection) oscillation frequency of about 4.85 GHz. The circuit operated over the range of about $f_i = 9-10$ GHz and $f_o = 4.5-5$ GHz at 13 dbm of input power. This is a ten percent bandwidth which is important in many modern day applications. By comparison, the circuit of FIG. 1 operating in the 11-12 GHz range required 18 dbm of input power to provide ten percent bandwidth and at about comparable power levels (e.g., 14 dbm) provided only about five percent bandwidth (Stapelton et al, supra). Thus, the performance of the present invention is significantly improved over the prior art.

No transformer balun is required at the output of the circuit which provides a substantial space saving. Further, the component values are all within the range of component values readily achieved by conventional MMIC fabrication techniques well known in the art. Hence, the circuit is well suited to MMIC applications. In addition, it has been found that the successful operation of frequency divider 20 does not require especially high Q components. This is very useful in MMIC applications.

Based on the foregoing description, it will be apparent to those of skill in the art that the present invention solves the problems and achieves the purposes set forth earlier, and has substantial advantages as pointed out herein, namely, it functions well at microwave frequencies, it is insensitive to component value variation and component Q and does not need especially high Q values, it adapts well to MMIC fabrication techniques, it provides at least a ten percent bandwidth at comparatively low power levels, and it operates at lower power levels than in the prior art.

While the present invention has been described in terms of particular elements and steps, these choices are for convenience of explanation and not intended to be limiting. For example, while various inductances and capacitances have been described and/or shown in FIG. 2 as simple L's and C's, those of skill in the art will understand that these may be replace by networks or other impedance elements or combinations of elements having the appropriate resonance properties or inductive or capacitance reactance at the frequencies of interest. In addition, while the active elements have been depicted as bipolar transistors, any active element or combination of active elements providing gain may be utilized provided that they have sufficient gain at the frequencies of interest. Persons of skill in the art will understand how to choose such components or combination of components based on the description herein.

Those of skill in the art will further understand based on the description herein, that the present invention applies to these and other choices of elements and steps, and that it is intended to include in the claims that follow, such variations as will occur to those of skill in the art based on the present disclosure.

I claim:

1. A frequency divider for receiving an input frequency $f_i$ and providing an output frequency $f_o = f_i/N$ where N is an even integer, comprising:

first and second amplifying devices, each having control, reference and output terminals;

first and second tuned circuits having high resonant impedance at $f_o$, wherein a first port of the first tuned circuit is coupled to the reference terminal of the firs amplifying device and a first port of the second turned circuit is coupled to the reference terminal of the second amplifying device and second ports of the tuned circuits are coupled to a port for receiving input frequency $f_i$;

a first inductance coupled between the control terminals of the first and second amplifying devices; and a first capacitance coupled between the reference terminals of the first and second amplifying devices.

2. The divider of claim 1 further comprising one or more impedances coupled to the output terminals of the amplifying devices.

3. The divider of claim 2 wherein the one or more impedances comprises a second inductance coupled to the output terminal of the first amplifying device and a third inductance coupled to the output terminal of the second amplifying device.

4. The divider of claim 1 wherein the port for receiving input frequency $f_i$ comprises a third amplifying device having an output terminal coupled to the second ports of the first and second tuned circuits and a control terminal coupled to an input for input frequency $f_i$ and a reference terminal coupled to a potential source, wherein when $f_i$ is applied to the input, the third amplifying device turns on, thereby coupling the input frequency $f_i$ to the second ports of the first and second tuned circuits.

5. The divider of claim 4 wherein when $f_i$ is removed form the input, the third amplifying device turns off, thereby substantially blocking the input frequency $f_i$ from the second ports of the first and second tuned circuits.

6. The divider of claim 5 further comprising one or more matching elements coupled between the third amplifying device and the input for frequency $f_i$.

7. The divider of claim 6 wherein the one or more matching elements comprise at least one further inductance coupled in series between the input and the control terminal of the third amplifying device.

8. The divider of claim 7 wherein the matching elements comprise at least one capacitance coupled in series between the at least one further inductance and the control terminal of the third amplifying device or the input for frequency $f_i$.

9. The divider of claim 1 further comprising a still further inductance coupled between an output terminal of one of the amplifying devices and an output for frequency $f_o$.

10. The divider of claim 1 wherein the port for receiving input frequency $f_i$ comprises a third amplifying device having an output terminal coupled to the second ports of the first and second tuned circuits and a control terminal coupled to an input for input frequency $f_i$ and a reference terminal coupled to a potential source, wherein when $f_i$ is applied to the input, the third amplifying device turns on, thereby providing a bias to turn on the first and second amplifying devices.

11. The divider of claim 10 wherein when $f_i$ is removed form the input, the third amplifying device turns off, thereby thereby removing the bias to turn off the first and second amplifying devices.

12. A frequency divider for receiving an input frequency $f_i$ and providing an output frequency $f_o = f_i/N$ where N is an even number, comprising:
first and second amplifying devices, each having control, reference and output terminals;
first and second tuned circuits having high resonant impedance at $f_o$, wherein a first port of the first tuned circuit is couple to the reference terminal of the first amplifying device and a first port of the second tuned circuit is coupled to the reference terminal of the second amplifying device and second ports of the tuned circuits are coupled to a port for receiving input frequency $f_i$; and
a closed loop circuit comprising the control and reference terminals of the first amplifying device and the reference and control terminals of the second amplifying device and an inductance and a capacitance, wherein the inductance and capacitance are chosen to provide a low impedance in the closed loop circuit at $f_o$, wherein the output frequency $f_o$ is at the output terminal of one of the amplifying devices;

13. The frequency divider of claim 12 wherein the inductance is coupled between the control terminals of the first and second amplifying devices and the capacitance is coupled between the reference terminals of the first and second amplifying devices.

14. The divider of claim 13 wherein the port for receiving input frequency $f_i$ comprises a device having an output terminal coupled to the second ports of the first and second tuned circuits and a control terminal coupled to an input for input frequency $f_i$ and a reference terminal coupled to a potential source, wherein when $f_i$ is applied to the input, the device couples the input frequency $f_i$ to the second ports of the first and second tuned circuits.

15. The divider of claim 14 wherein when $f_i$ is removed from the input, the device substantially blocks the input frequency $f_i$ from the second ports of the first and second tuned circuits.

16. The divider of claim 15 further comprising one or more matching elements coupled between the device and the input for frequency $f_i$.

17. A method for dividing an input frequency $f_i$ by an even number N to product an output frequency $f_o = f_i/N$, comprising:
providing input frequency $f_i$;
coupling $f_i$ to a frequency generator comprising two amplifiers, each having control, reference and load terminals, and producing output frequency $f_i/N$ when $f_i$ is present, wherein $f_i$ is coupled to the reference terminals;
coupling oscillatory signals between the control and reference terminals of the two amplifiers through a resonant circuit comprising inductance and capacitance wherein the inductance and capacitance are chosen to produce resonance at $f_i/N$; and
operating the resonant circuit and the two amplifiers to produce an oscillating signal of frequency $f_o = f_i/N$ at an output of one of the amplifiers.

18. The method of claim 17 wherein the second coupling step comprises coupling the signals through a resonant circuit comprising at least one inductance between the control terminals of the two amplifiers and at least one capacitance between the reference terminals of the two amplifiers, wherein the inductance and capacitance are chosen, including the effects of any parasitic impedance associated with the control and reference terminals of the two amplifiers, so as to produce resonance at $f_i/N$.

19. The method of claim 17 further where in the coupling step comprises coupling input frequency $f_i$ to the frequency generator via a controller for activating the frequency generator in the presence of $f_i$.

20. The method of claim 19 wherein the step of activating the frequency generator includes biasing the amplifiers into an active state for producing $f_i/N$ when $f_i$ is present and biasing the amplifiers into an inactive state when $f_i$ is absent.

* * * * *

UNITED STATES PATENT AND TRADEMARK OFFICE
CERTIFICATE OF CORRECTION

PATENT NO. : 5,192,875

DATED : March 9, 1993

INVENTOR(S) : Ronald F. Kielmeyer, Jr.

It is certified that error appears in the above-identified patent and that said Letters Patent is hereby corrected as shown below:

Column 2, line 62, claim 1, change "firs" to --first--.

Column 1, line 24, claim 5, change "form" to --from--.

Column 1, line 54, claim 11, change "form" to --from--.

Column 1, line 65, claim 12, change "couple" to --coupled--.

Column 2, line 34, claim 17, change "product" to --produce--.

Column 1, line 56, claim 11, change "thereby thereby" to --thereby--.

Signed and Sealed this

Eleventh Day of January, 1994

*Attest:*

BRUCE LEHMAN

*Attesting Officer*  *Commissioner of Patents and Trademarks*